United States Patent [19]

Huber et al.

[11] Patent Number: 4,766,520

[45] Date of Patent: Aug. 23, 1988

[54] INJECTION MOLDED CIRCUIT HOUSING

[75] Inventors: Duane Huber, Bartlett; James P. Liautaud, Cary, both of Ill.

[73] Assignee: Capsonic Group, Inc., Elgin, Ill.

[21] Appl. No.: 938,416

[22] Filed: Dec. 5, 1986

[51] Int. Cl.$^4$ .............................................. H05K 1/02
[52] U.S. Cl. .................................... 361/421; 361/395
[58] Field of Search .................. 357/70; 361/393-395, 361/399, 421

[56] References Cited

U.S. PATENT DOCUMENTS

| 2,478,469 | 8/1949 | Earle ..................................... 361/421 |
| 3,469,684 | 9/1969 | Keady et al. ......................... 361/421 |
| 3,659,821 | 5/1972 | Sakamoto et al. .................... 357/70 |
| 4,158,745 | 6/1979 | Keller ................................... 361/421 |
| 4,546,412 | 10/1985 | Nakazawa et al. ................. 361/421 |

Primary Examiner—A. D. Pellinen
Assistant Examiner—Gregory D. Thompson
Attorney, Agent, or Firm—Lockwood, Alex, FitzGibbon & Cummings

[57] ABSTRACT

An injection molded housing for thick film ignition circuitry used in conjunction with automobile or other vehicle engines includes an integral lead frame for providing electrical connections between the circuitry and engine sensors and ignition components. To provide protection against lead frame failure as a result of vibration and thermal stresses encountered in the engine environment, residual stress cracking caused by varying flexure of the lead frame during the manufacturing process is prevented by utilizing a pre-mold base in which the lead frame is placed prior to subsequent encapsulating of both the lead frame and the pre-molded base. The result is a lead-frame housing construction of greater reliability.

8 Claims, 4 Drawing Sheets

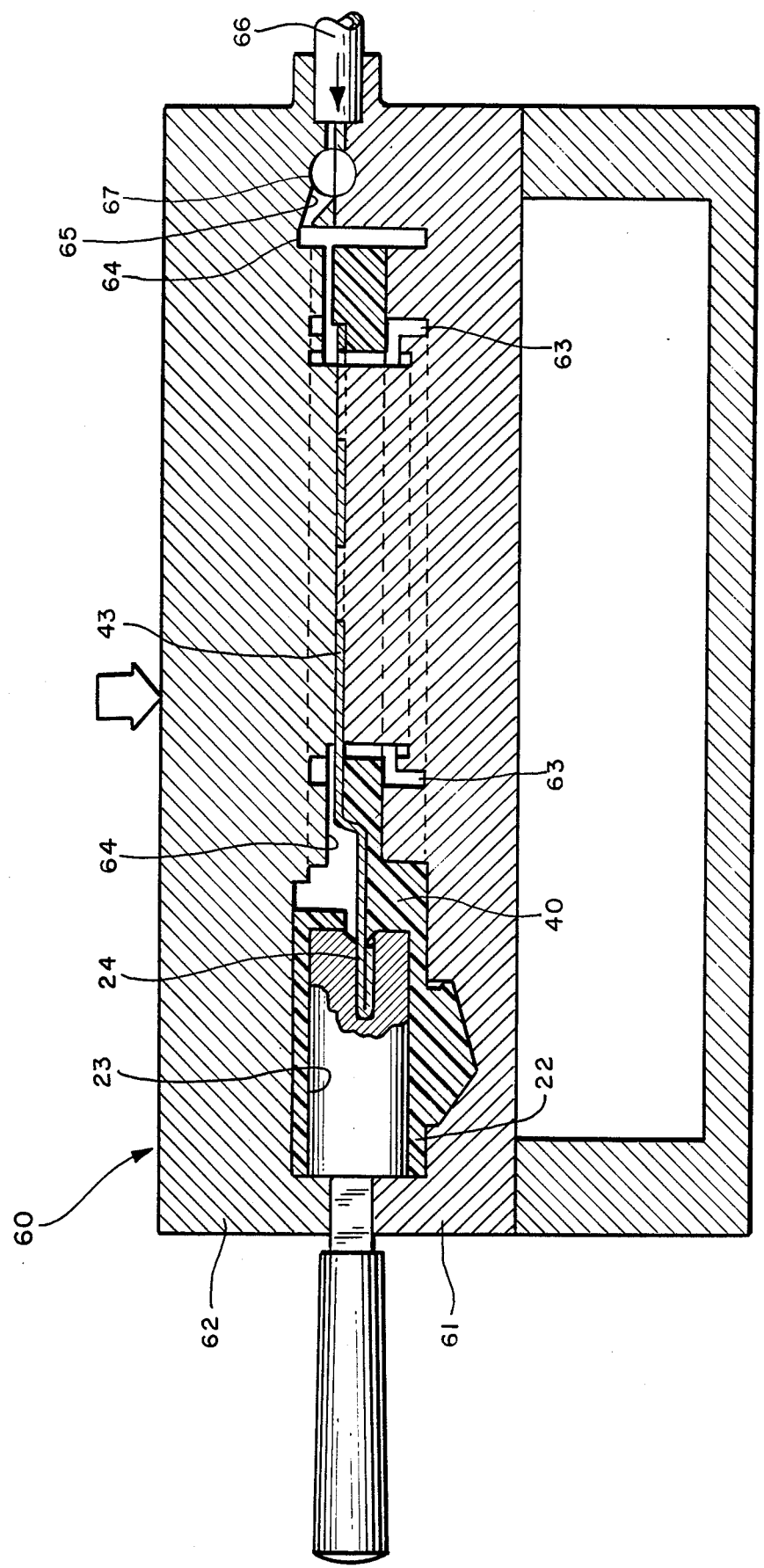

INJECTION MOLDED CIRCUIT HOUSING

BACKGROUND OF THE INVENTION

The present invention is related generally to housings for electronic circuitry, and more particularly to a housing for a thick film engine ignition circuit for an automobile or other vehicle.

With the advent of solid-state electronics, the use of thick film solid state circuits has become more commonplace in providing electronic controls that monitor and control the operation of an engine. Because of the need for proximity to the engine, these circuits operate in the engine compartment and are subject to harsh environments including thermal and mechanical shock.

As a consequence, the thick film circuits are typically enclosed in a plastic housing that contains a molded-in metal insert, or lead frame, that makes contact, through wire bonding, to the thick film circuit. It has been the plastic molding industry's practice to manufacture this housing by supporting the lead frame at various points by extending cores from one-half of the mold to matching cores at the other half of the mold, thereby supporting the lead frame between these cores. This procedure was designed to "lock" the lead frame in the center of the cavity prior to injecting the plastic. Once the mold was closed, the lead frame was "locked" and the hot plastic flowed over and around the frame, filling the mold and trapping the frame in the molding.

Further, to reduce costs, it has been industry practice to double up those portions of the lead frame which make contact with the external connector, thereby doubling the effective thickness of the stamping. This practice allowed a very thin stamping for the electrical paths and saved a substantial amount of money in the material used and in the cost of the stamping die.

A problem, however, existed in the portion of the lead frame which was not entrapped between the opposing cores. The unsupported thin metal contact strips became subject to a varying kinetic stress due to the fluid dynamics of the injected, hot-melted plastic which varied greatly from shot to shot due to the constantly changing viscosity during the injection cycle, thereby making the flow unpredictable at any given point over any given time segment. The varying residual stress cracking of the lead frame was due to the varying flexure the lead frame goes through during the injection process, causing metal fatigue at varying points along the lead frame. On occasion, this varying flexure created thin, hairline fractures that separated the lead frame. As the plastic solidified, it shrank and drew the lead frame together, enabling the insert molded module to pass stringent electrical high-pot tests, and to appear as an acceptable, non-fractured device.

Unfortunately, in use catastrophic failures did occur, opening an electric connection and rendering at least a portion, and possibly all of the electronic control circuit, and possibly the engine itself, inoperative. Thus, the extremely harsh engine vehicle environment in which thick film ignition circuitry is utilized has placed stringent structural requirements on the module housing containing that circuitry.

The purpose of this invention is to provide a module construction applicable to an ignition module incorporating a lead frame composed of metal contact strips less than 0.020 inches in thickness and which eliminates any movement of the lead frame which would cause stress thereon during the molding operation.

The invention calls for a circuit housing which includes a pre-mold base which supports the lead frame during a molding operation resulting in encapsulation of the pre-mold base and lead frame. The lead frame is supported on the pre-mold base and the entire assembly is encapsulated thereby trapping the lead frame solidly to the pre-mold base with assured centering of the same within the housing. To prevent the lead frame from "floating" during the molding process, the injection gates in the second process are preferably located above the lead frame and the pre-molded base subassembly, whereby the surface injection pressure of the injected plastic is always greater at the injection side of the cavity than at the bottom side, thereby maintaining a constant higher pressure above the lead frame than below it. This allows the frame to be firmly secured over its entire pre-mold surface instead of at "points", thereby preventing flexure from taking place during formation of the housing during the molding process.

The result is that flexural variance in the lead frame during the injection process is eliminated, thereby eliminating induced stress and subsequent lead frame failure.

Accordingly, it is an object of the present invention to provide an improved construction for an engine ignition module.

It is a more specific object of the present invention to provide an ignition module housing providing improved protection against thermal and vibration-induced stress.

It is another object of the present invention to provide construction an ignition module wherein the lead frame of the module is not subjected to molding stresses during formation of said module.

SUMMARY OF THE INVENTION

The invention is directed to a housing for an electrical circuit requiring connection to external electrical contacts. The housing includes a lead frame to connect the circuit pads to the housing's external contacts. A pre-molded base receives the lead frame and an overmold is formed over and around that assembly, thereby encapsulating same.

BRIEF DESCRIPTION OF THE DRAWINGS

The features of the present invention which are believed to be novel are set forth with particularity in the appended claims. The invention, together with the further objects and advantages thereof, may best be understood by reference to the following description taken in conjunction with the accompanying drawings, in the several figures of which like reference numberals identify like elements, and in which:

FIG. 10 is a cross-sectional view of tooling for forming the overmold over the pre-mold and lead frame of the circuit housing in accordance with the invention.

DESCRIPTION OF THE PREFERRED EMBODIMENT

Figure 1:
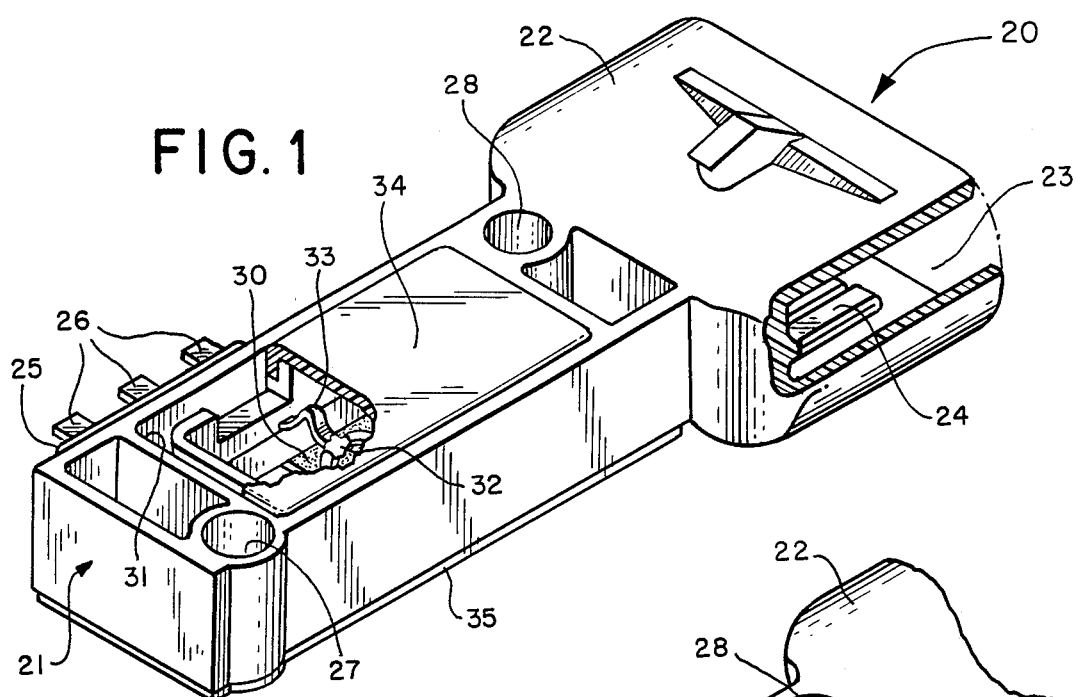
FIG. 1 is a perspective view of an ignition module incorporating the electrical circuit housing of the invention partially broken away to show the circuit and electrical connection elements thereof.

Referring to the Figures, and particularly to FIG. 1, an ignition module 20 incorporating a circuit housing 21 (FIG. 2) constructed in accordance with the invention is seen to include, in an illustrative embodiment, a female connector portion 22 having an open-ended recess 23 for receiving a male connector (not shown) of compatible dimensions. A plurality of flat strip-like contacts 24 extend from the rear wall of recess 23 to engage complimentary contacts on the connector plug. An additional connector portion 25 having a plurality of strip-like projecting contacts 26 may be provided along one side of housing 21 to receive a female connector (not shown). A pair of apertures 27 and 28 may be provided for mounting the ignition module within a vehicle at an appropriate location near the engine.

Figure 2:
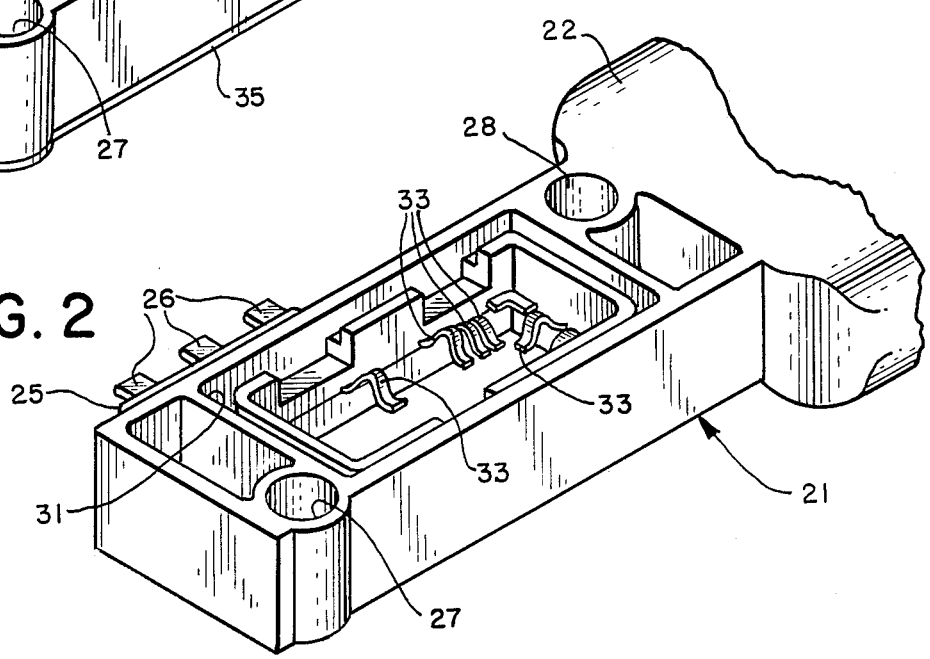
FIG. 2 is a fragmentary perspective view of the circuit housing of FIG. 1 with the top cover removed.
Figure 6:
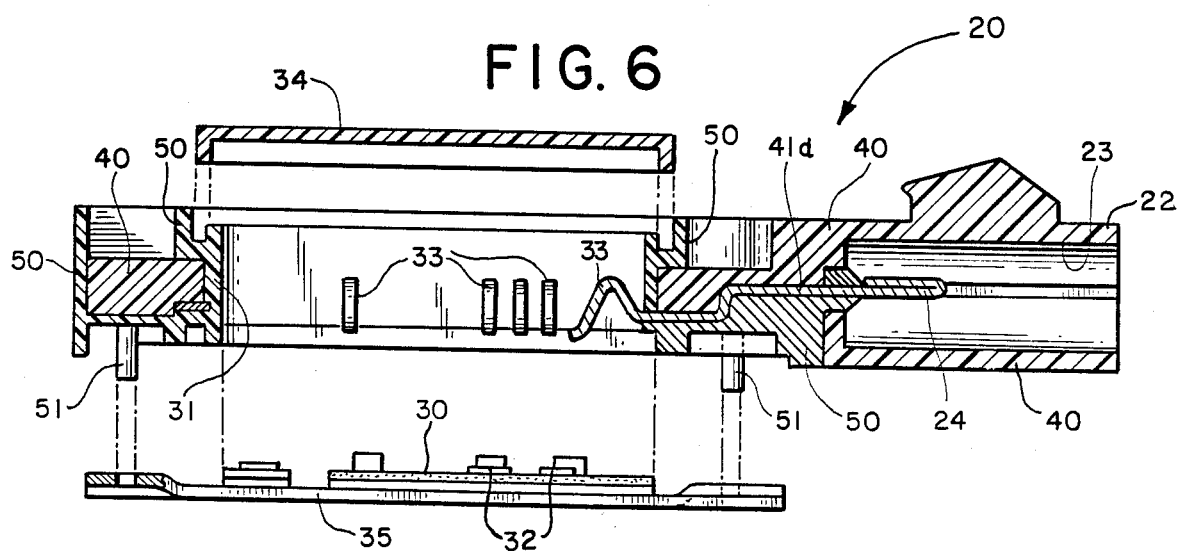
FIG. 6 is a cross-sectional view of the circuit housing taken along line 6—6 of FIG. 4.

As shown in FIGS. 1, 2 and 6 an electrical circuit 30, which in an automotive application may be of thick film construction, is located within a recess 31 formed in module 20. The circuit 30 contains a number of connection pads 32 for receiving a like number of lead frame segments 33 which extend from the sidewalls of recess 31 so as to be in registration with respective connection pads when circuit 30 is positioned within the recess as shown. A cover 34 formed of plastic or other non-conductive material may be mounted over the top (as viewed in FIG. 1) surface of recess 31 to protect circuit 30 from contamination. In addition, a cover 35 may be provided over the bottom surface for a similar purpose, or to provide a heat sink or electrical ground for the circuit board.

In practice, the circuit housing 21 is formed as a separate and integral unit, and circuit 30, after assembly and testing, is mounted within recess 31. Connections are then made to the projecting lead frame segments 33 at the appropriate connection pads 32, after which covers 34 and 35 are attached.

Figure 3:
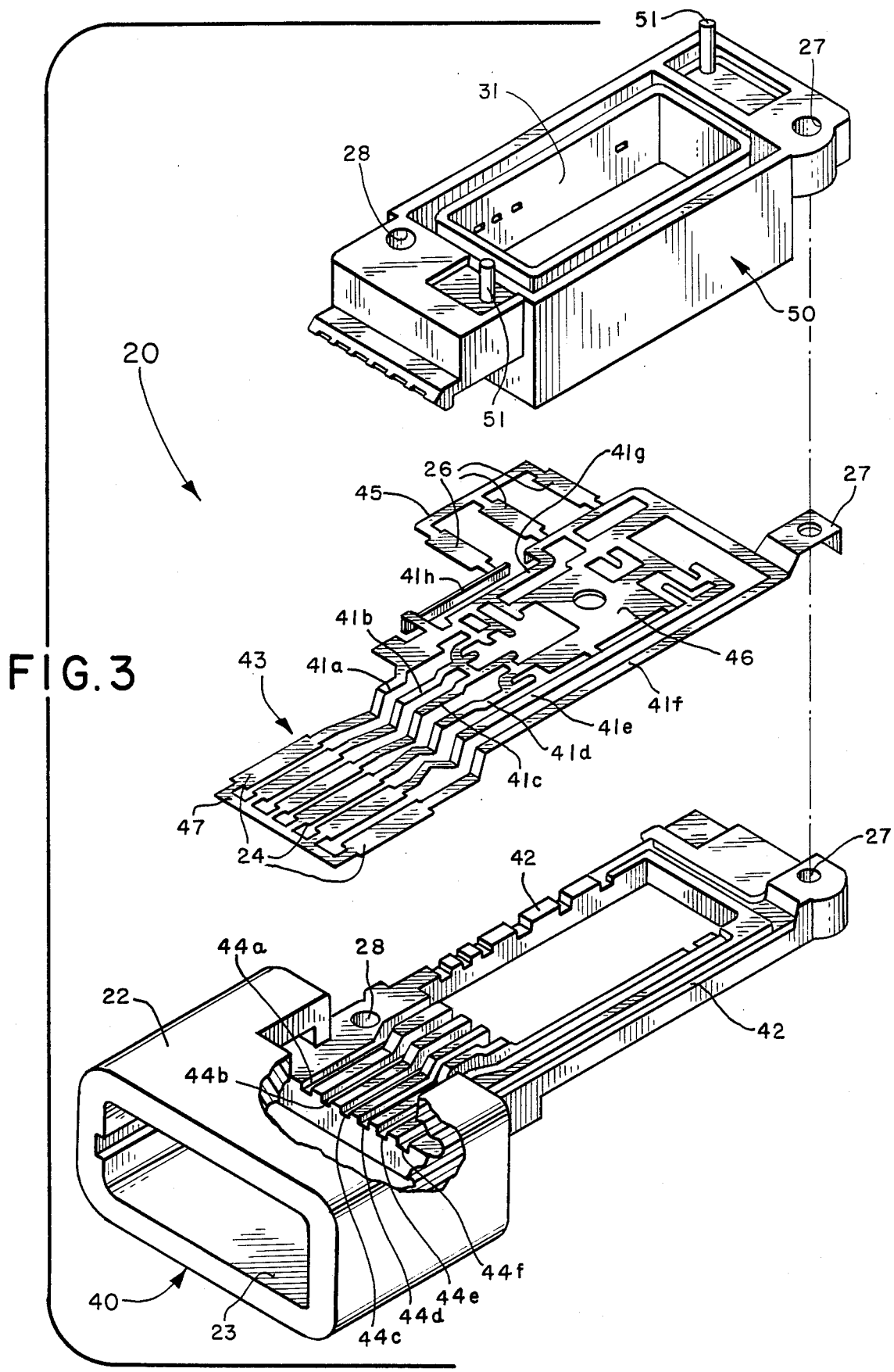
FIG. 3 is an exploded perspective view of the principal elements of the electrical circuit housing of the invention.
Figure 4:
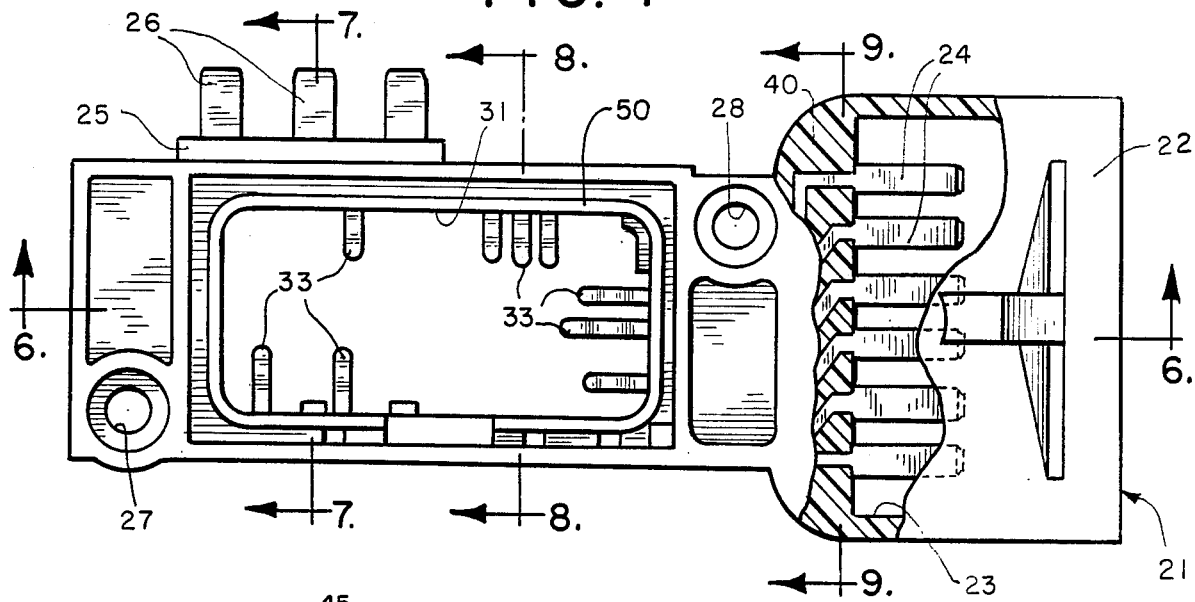
FIG. 4 is a plan view of the circuit housing of FIG. 3 partially broken away to show the principal elements thereof.

Referring to FIG. 3, the module 20 is seen to include, in accordance with the invention, a pre-mold member 40 for receiving and supporting a lead frame 43. The lead frame consists of a plurality of individual lead frame segments 41a–41h which establish electrical communication between individual connection pads 32 on circuit 30 and selected ones of contacts 24 and 26. To this end, the lead frame segments 41a–41h may be formed for circuituitous routing between end points in registration with particular connection pads and the desired contact locations. The lead frame segments 41a–41h are physically spaced apart to maintain electrical isolation, and may typically be formed of a thin metallic material having a thickness less than 0.020 inches. The ends of contacts 24 and 26 may be folded over on themselves to form a thicker and mechanically more rigid terminal. It will be observed that lead frame 43 may be formed such that the individual lead frame segments 41a–41h lie in a plurality of parallel-spaced planes, the segments being bent so as to form a transition between the planes as required to complete desired electrical connections between connection pads 32 and contacts 24 and 26.

Pre-mold member 40, as best viewed in FIG. 3, includes the enlarged female connector portion 22 at one end thereof integrally formed with a generally rectangular frame-like portion defining top surface portions 42 and extending rearwardly of connector portion 22. This frame-like poriton including surface portions 42 is ultimately at least substantially encapsulated by an overmold 50 to be described. If desired, pre-mold member 40 may have a plurality of channels 44a–44f on the top (as viewed in FIG. 3) surface 42 thereof. The channels 44a–44f are arranged on surface 42 such that lead frame 43 fits precisely into the channels when the lead frame 43 and the pre-mold member 40 are combined. Channels 44a–44f are precisely dimensioned in width and depth so as to precisely receive the lead frame 43 in precise alignment without any possibility of shifting during a subsequent molding operation.

Figure 5:
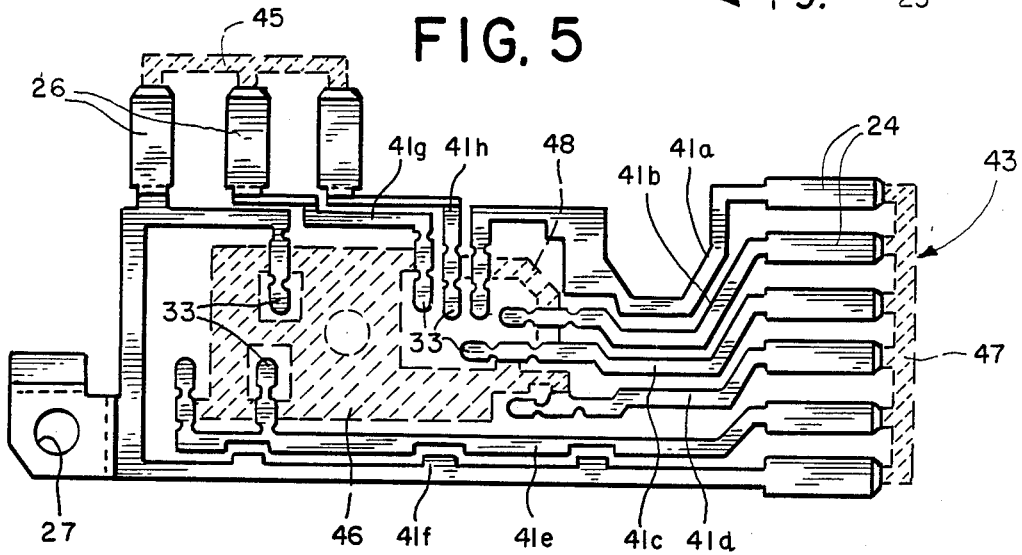
FIG. 5 is a plan view of a lead frame for use in the circuit housing of FIG. 4.

During positioning of lead frame 43 in the pre-mold 40, the individual lead frame segments 41a–41h are attached by connecting portions 45–48 as shown by broken lines in FIG. 5. Once the assembly of module 20 has been completed, these connecting portions are broken off in a metal shearing operation in accordance with procedures well known to the art.

Figure 7:
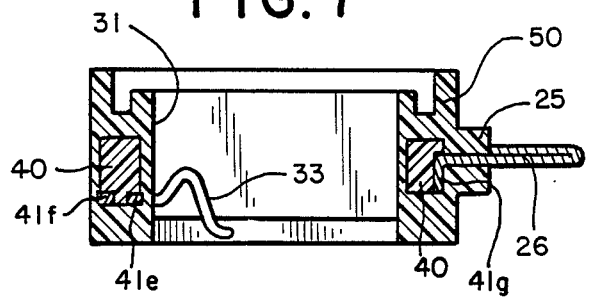
FIG. 7 is a cross-sectional view of the circuit housing taken along line 7—7 of FIG. 4.
Figure 8:
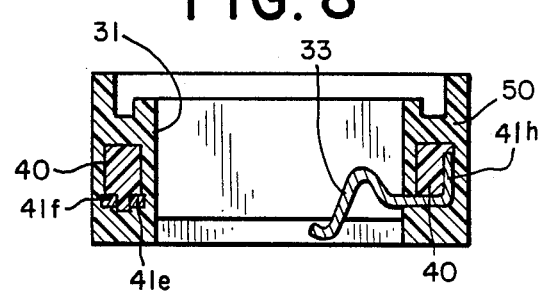
FIG. 8 is a cross-sectional view of the circuit housing taken along line 8—8 of FIG. 4.
Figure 9:
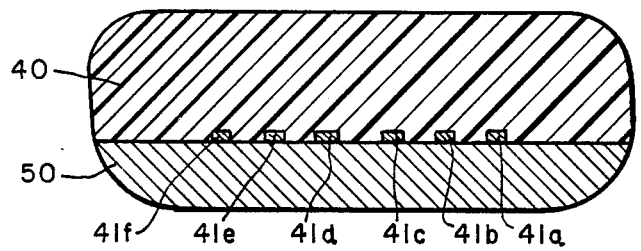
FIG. 9 is a cross-sectional view taken along line 9—9 of FIG. 4.

Subsequent to such shearing of connecting segments 45–48, the projecting end portions of lead frame segments 41a–41h may be folded back on themselves or otherwise reshaped such that redirected or reinforced contact portions 24, 26 and 33 are formed. As shown in FIGS. 6 and 7, such folding over of the projecting ends allows the lead frame segments to serve as double thickness contacts 24 and 26 of connector portions 22 and 25 of the module 20.

To maintain lead frame segments 41a–41h precisely within pre-mold 40, an overmold 50 is formed over the pre-mold 40 and a portion of lead frame 43. As shown in FIGS. 4 and 6–9 this overmold securely locks the individual lead frame segments 41a–41h with respect to pre-mold 40 and defines the sidewalls of recess 31 to insure accurate positioning of circuit 30 (FIG. 1). If channels 41a–41f have been provided in pre-mold base 40, the overmold 50 will accurately and securely lock the lead frame segments 41a–41h therein. The overmold 50, which may be formed of a conventional plastic material, may also define other external features of module 20 such as projecting posts 51 for mounting the bottom cover 35 and the sidewalls of apertures 27 and 28 for mounting the module.

In manufacturing module 20 the pre-mold 40 is first formed using conventional techniques. This may be done with a high degree of precision since the structure is relatively thin and shrinkage is minimized. Lead frame 43, which may be stamped by conventional techniques from a sheet of copper or other appropriate electrically-conductive material, is deposited by manual or automated assembly techniques such that the individual lead frame segments 41a–41h of the lead frame are received on surface 42 or, if channels 44a–44f have been provided in surface 42, in their respective channels. Then, as shown in FIG. 10, the assembled components are inserted in one-half of a molding tool 60. A top tooling half 62 is arranged in a conventional manner to come into operative engagement with the bottom half 61.

To provide for accurate placement of the assembled pre-mold base 40 and lead frame member 43 of a cavity 63 conforming exactly to the dimensions of the assembled components is provided in the working surface of tool section 61. To provide for accurate definition of the external surfaces of the overmold 50 a cavity 64 is provided in the top tool half 62. To allow for introduction of plastic into cavity 64, a network of injection ports 65 are provided in tooling section 62 to introduce plastic in fluid form under pressure from an inlet 66 into cavity 64. A plurality of gates 67 insure that cavity 64 is efficiently and evenly filled with fluid plastic and pre-mold base 40 and lead-frame 43 are adequately encapsulated during the injection molding operation. Preferably, these gates 67 in cavity 64 are all arranged so that during injection the pressure above lead frame 43 is greater than below. Thus, the force of the plastic being injected forces the lead frame 43 down onto surface 42 of pre-mold base 40. This precludes any shift in position of the lead frame and minimizes the stress to which the segments are subjected during the molding operation.

After this injection molding operation the assembly of circuit housing 21 is complete, the housing is removed from tooling 60 and allowed to cool in a conventional manner prior to further assembly. It will be appreciated that by reason of the presence of the pre-mold member 40 no shift in position of lead frame segments 41a-41h is possible during the molding operation, and no stress can be applied by reason of the support of the underlying surface of member 40.

Thus, a precision housing is formed which is particularly well adapted for use in hostile environments such as that found in the engine compartment of an automobile. By reason of the support provided to the individual lead frame segments during the molding operation the existence of of stress fractures that might cause failure after a period of use under adverse conditions is avoided. The result is a more reliable ignition module, and hence a more reliable vehicle.

While a particular embodiment of the invention has been shown and described, it will be obvious to those skilled in the art that changes and modifications may be made therein without departing from the invention in its broader aspects, and, therefore, the aim in the appended claims is to cover all such changes and modifications as fall within the true spirit and scope of the invention.

We claim:

1. An automotive ignition module comprising:
   a pre-mold base member including a series of channels therein;
   a lead frame including a plurality of electrically conductive internal segments and outwardly projecting contacts mounted on said pre-mold base member with at least some of said segments confined within said channels;
   an overmold encapsulating at least a portion of said pre-mold base member and locking said lead frame in said channels;
   top and bottom cover members enclosing said pre-mold base member and said overmold; and
   circuit means carried by at least one of said cover members and electrically connected to said internal segments of said lead frame.

2. A automotive ignition module of claim 1 wherein at least a portion of said projecting contacts define in part a female connector portion forming a part of said pre-mold base.

3. An automotive ignition module of claim 1 wherein at least a portion of said contacts further project from cooperating wall portions of said pre-mold base member and said overmold to define a male connector.

4. A automotive ignition module of claim 3 wherein each of said contacts of said connector are reversely bent upon themselves to rigidify the same.

5. An automotive ignition module comprising:
   a pre-mold base member having a frame-like portion and including a series of channels therein;
   a lead frame including a plurality of electrically conductive internal segments and outwardly projecting contacts mounted on said pre-mold base member with at least some of said segments confined within said channels;
   an overmold of frame-like configuration encapsulating at least the frame-like portion of said pre-mold base member and locking said lead frame in said channels;
   top and bottom cover members enclosing said frame-like portions of said pre-mold base member and said overmold; and
   circuit means carried by at least one of said cover members and electrically connected to said internal segments of said lead frame.

6. An automotive ignition module of claim 5 wherein at least a portion of said projecting contacts define in part a female connector portion forming a part of said pre-mold base.

7. An automotive ignition module of claim 5 wherein at least a portion said contacts further project from cooperating wall portions of said pre-mold base member and said overmold to define a male connector.

8. An automotive ignition module of claim 7 wherein each of said contacts of said connector are reversely bent upon themselves to rigidify the same.

* * * * *